(12) United States Patent
Gregoratti et al.

(10) Patent No.: US 8,389,069 B2
(45) Date of Patent: Mar. 5, 2013

(54) METHOD FOR MARKING AN ITEM BASED ON COLOUR CENTRES

(75) Inventors: Luca Gregoratti, Bagnaria Arsa (IT);
Matteo Maria Dalmiglio, Besozzo (IT)

(73) Assignee: Elettra-Sincrotrone Trieste Societa' Consortile Per Azioni, Frazione Basovizza Area Science Park (IT)

( * ) Notice: Subject to any disclaimer, the term of this patent is extended or adjusted under 35 U.S.C. 154(b) by 713 days.

(21) Appl. No.: 12/449,270

(22) PCT Filed: Feb. 4, 2008

(86) PCT No.: PCT/EP2008/051320
§ 371 (c)(1),
(2), (4) Date: Jul. 30, 2009

(87) PCT Pub. No.: WO2008/095884
PCT Pub. Date: Aug. 14, 2008

(65) Prior Publication Data
US 2010/0068374 A1    Mar. 18, 2010

(30) Foreign Application Priority Data
Feb. 5, 2007    (IT) .................................. PD07A0036

(51) Int. Cl.
*C08J 7/18*    (2006.01)
*B05D 3/00*    (2006.01)
*B05D 3/06*    (2006.01)

(52) U.S. Cl. .......................... 427/552; 427/561; 427/566

(58) Field of Classification Search .................. 427/532, 427/551, 552, 533, 595, 8, 10, 585, 596, 427/587, 592, 593, 561, 566; 250/492.1, 250/492.3, 330, 334
See application file for complete search history.

(56) References Cited

U.S. PATENT DOCUMENTS

| | | |
|---|---|---|
| 6,211,526 B1 | 4/2001 | Huston et al. |
| 2005/0281948 A1* | 12/2005 | Grace et al. ................ 427/248.1 |
| 2006/0165216 A1 | 7/2006 | Baldacchini et al. |

FOREIGN PATENT DOCUMENTS

| | | |
|---|---|---|
| GB | 1587232 | 4/1981 |
| WO | WO9914043 | 3/1999 |

OTHER PUBLICATIONS

Montereali et al, Luminescent Nanostructures based on colour centres produced in LiF film by direct writing with an X-Ray microprobe, Phys. Stat. Sol. (c), vol. 2 No. 1, 200, p. 298-301.*

(Continued)

*Primary Examiner* — Dah-Wei Yuan
*Assistant Examiner* — Nga Leung V Law
(74) *Attorney, Agent, or Firm* — Stetina Brunda Garred & Brucker

(57) ABSTRACT

The invention relates to a method for marking an item based on the formation of color centers on a lithium fluoride film. The method provides for the deposition of thin LiF films on the item or on mark supports to be applied to the item and the formation of the color centers by irradiation, thus forming an identification mark. Optionally, the method may provide for the detection of the identification mark and the control of its authenticity. The method may be employed both to guarantee the authenticity of the item and to classify it. The application of the method is particularly advantageous in the field of high value goods and specifically in the field of cultural objects.

22 Claims, 6 Drawing Sheets

OTHER PUBLICATIONS

Somma et al, Production and characteization of multilayer KCI: LiF thin films on glass, J. Vac. Sci. Technol. A., 1393), year 1995, p. 1013-1016.*

M. Kumar et al. "Studies of Swift Heavy Ion Induced Colour Centres in LifThin Films Deposited on Silica Substrates"; Journal of Physics; Jun. 30, 2006; p. 2935-2940.

Rosa M. Montererali; "Optical Gain of F2 Colour Centres in LiF Confining Structures Realised by Electron-Beam Lithography"; Optics Communication; Aug. 1, 2002; p. 201-208.

M Cremona et al.; "Optical Waveguides Produced in LiF by MeV Ion Beam Bombardment"; Applied Physics Letter; Nov. 25, 2002; vol. 81, #22; p. 4103-4105.

* cited by examiner

METHOD FOR MARKING AN ITEM BASED ON COLOUR CENTRES

FIELD OF THE INVENTION

The present invention relates to a method for marking an item consisting of the application to items or supports to be applied to items, the authenticity of which is to be guaranteed, or which are to be classified, of an identification mark obtained by the formation of colour centres with ionising radiations on a lithium fluoride (LiF) film, which are deposited at an ambient pressure.

STATE OF THE ART

A Colour Centre (or CC) is a defect in a crystal solid including the vacancy of a negative ion at a site of the solid and the presence of an electron at the same site. Such defects are capable of absorbing light and lead crystals, which are normally transparent, to be coloured. Such defects may be obtained by irradiating the sample with an electromagnetic radiation or a ionising beam having the appropriate features.

Many are the materials on which a CC may be created, but the most studied in the scientific field is without any doubt LiF. Indeed, the formation of CCs in LiF amorphous crystals and films has been studied with various types of irradiation: photons, electrons, neutrons and different kinds of ions. The reason why LiF results being the most studied material resides in that the main types of CCs which may be created (technically referred to as $F_2$ and $F_3^+$) may be produced in a fairly simple manner, in a high number and absorb and emit radiations in particularly favourable visible bands. Not least, LiF is a transparent material having determined optical properties and, in theory, it could have different applications even if, in practice, some of its features (as, for instance, high hygroscopicity) lead it to be poorly desirable for "actual" applications, as they make it difficult to manipulate.

The current state of research on CCs focuses, as may be deduced from the most recent publications on scientific journals, on the study of the features of CCs created with the different ionising sources available; indeed, the different parameters characterising the formation thereof (e.g. density, details of the absorption and emission spectra) vary depending on the features of the source used for the formation of CCs (M. Kumar, F. Singh, S. A. Khan, A. Tripathi, D. K. Avasthi and A. C. Pandey, "Studies of swift heavy ion induced colour centres in LiF thin films deposited in silica substrates", J. Phys. D: Appl. Phys. 39 (2006) 2935-2940). There are also studies aimed at possible applications of CCs as, for instance, the possibility to generate waveguides thus forming "tracks" of CCs (R. M. Montereali and M. Piccinini, "Optical gain of $F_2$ colour centres in LiF confining structures realised by electron-beam lithography", Optics Communications 209 (2002) 201-208; M. Cremona, J. A. M. Pereira, S. Pelli and G. C. Righini, "Optical waveguides produced in LiF by MeV ion beam bombardment", Appl. Phys. Lett. 81 (2002) 4103-4105).

However, in these fields, research is carried out with often very expensive instruments and in the attempt to isolate the measurement as much as possible from possible interferences due to the external environment. For instance, in many cases, LiF crystals are used instead of amorphous films, because crystals represent ordered sets of atoms with very little impurities possessing well-defined inherent properties which in many cases may be predicted in theory, whereas in amorphous films these may depend on the degree of "disorder" of the atoms forming them. Furthermore, the evaporations are carried out in vacuum chambers (very often in an ultra-high-vacuum environment (UHV)), because this guarantees that possible gaseous elements in the atmosphere are not deposited on the surface or even penetrate in the crystals thus altering measurements, whereas the irradiation of the samples occurs in the substantially optimal conditions of pressure, temperature and distance. All of these conditions make the application of this technology very difficult on a large scale because they imply very high costs for the required technical equipment, as well as a suitable preparation and operative manual ability of the technicians in charge.

Another possible limitation for the use on a large scale derives from the fact that LiF is known to be dangerous if swallowed in great amounts or if it remains in contact for a long period with delicate parts of the body, as, for instance, the eyes. A use thereof on a large scale or on everyday use goods must therefore be provided with the possibility of operating in a protected manner in order to avoid environmental contaminations and with the final protection of the films to avoid contact with the film and/or its alteration and/or removal due to accidental contacts.

The problem of guaranteeing the authenticity of high value items is deeply felt and many anti-counterfeiting systems have been suggested, mostly on laser marking technologies.

This problem is particularly felt in the field of the preservation of cultural objects, where the need to be provided with identification systems for works of art represents a requirement both for anti-counterfeit purposes and classification purposes.

Indeed, without considering the special care required when handling these artefacts, it is very difficult to apply anti-counterfeit or classification systems on items which must be displayed in front of a public and the view of which may not be "disturbed" by foreign elements. Clearly, this problem is worse in the case of small size items as, for instance, coins, archaeological finds, etc.

The application of the CC technology for the implementation of marking methods for anti-counterfeit or classification purposes may be suitable to satisfy the need in this important field. Indeed, LiF is a transparent material which, if deposited in the form of a very thin film, does not alter the visible features of the item on which it is deposited. A text or a picture serving as an identification mark (hereinafter also referred to as mark) may be produced on this film by means of a ionising radiation used as a writing or drawing system, i.e. CCs may be created only on determined areas, which, if properly illuminated, emit light highlighting the luminous text or picture.

It is therefore an object of the present invention to provide a marking method based on the exploitation of the formation of CCs on a LiF film by means of the use of ionising radiations, in which the application of LiF films and the following arrangement of the identification mark are carried out in mild conditions and by an easy application.

It is another object of the present invention to provide the use of an easily available instrument also having reasonably restricted management costs.

SUMMARY

The method implemented by the Inventors fulfils the above mentioned purposes, as it comprises the overcoming of some limitations deriving from the use of CCs in the conditions in which it is used in research laboratories where the aims are mainly scientific.

In a first aspect, the present invention therefore provides a marking method of an item comprising at least the steps of:

depositing by evaporation on the item or on a mark support to be applied to the item to be marked a lithium fluoride film having a thickness of at least 20 nm obtained by evaporating the same at an atmospheric pressure in an atmosphere consisting of air or nitrogen;

irradiating the lithium fluoride film previously obtained by means of a ionising radiation beam having an energy of at least 0.4 keV controlled with computerised means to produce the desired identification mark.

Optionally, the object method of the present invention comprises the further step of:

detecting the presence of the previously obtained identification mark by illuminating the same by means of a light source emitting a blue-ultraviolet light and optionally an orange filter.

In a second aspect, the present invention provides an apparatus for the method for marking an item comprising:

a movable item-holder on which the item or the mark support to be applied to the item, on which the identification mark is to be produced, is placed;

a lithium fluoride evaporator formed by a crucible adapted to contain the same, means to heat the lithium fluoride to the evaporation temperature of the same and means required for the calibration of the evaporated flow;

an instrument emitting a ionising radiation beam having at least an energy of 0.4 keV controlled by computerised means for the carrying out of the identification sign by means of controlled irradiation of the lithium fluoride film;

and optionally a detection system for the identification mark having a light source in the region of blue-ultraviolet and possibly an orange filter to mask the diffused blue-ultraviolet and allow the detection of the red-orange light emitted by the identification mark characterised in that the movable item-holder, the evaporator, the instrument emitting the ionising radiations are contained in a chamber capable of guaranteeing protection to the operator and connected to means suitable to obtain the controlled pressure and atmosphere conditions during the evaporation step and the irradiation step.

The advantages achievable with the present invention will become more apparent for the technician of the field from the following detailed description of particular embodiments given by way of example and not limitation, with reference to the following figures.

DETAILED DESCRIPTION OF THE INVENTION

Figure 1:
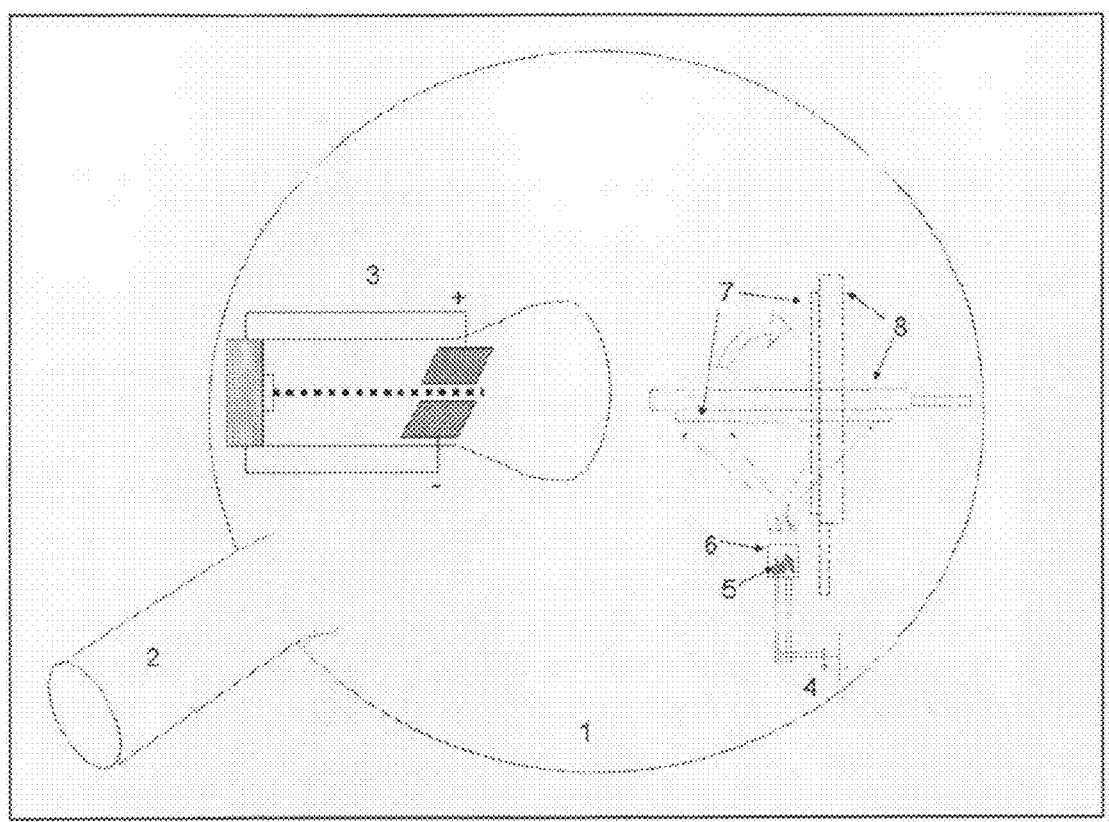
FIG. 1: the figure shows, by way of example, a diagrammatic view of a single chamber (1) connected with relative means (2) suitable to obtain the pressure and atmosphere conditions desired, in which the following are placed for performing the marking: a device for the evaporation of LiF formed by a crucible (6) for LiF (5) connected to a heating means (4); an item to be marked (7) placed on a movable item-holder (8) with appropriate means suitable for its rotation on a longitudinal or transverse axis; a means for the irradiation of the LiF film obtained by evaporation (3). The amplitude of the rotation on the longitudinal or transverse axis of the movable item-holder (8) substantially depends on the position of the evaporation and irradiation devices and is achievable with a manipulator (not shown in the figure) which allows the optimal orientation thereof towards the two above mentioned devices depending on their position.

The marking method which is the object of the present invention is focused on the production of CCs on an amorphous lithium fluoride (LiF) film that is evaporated so as to avoid the use of crystals and avoid the use of vacuum systems for the step of depositing LiF. Atmospheric pressure evaporations have surprisingly produced positive results, in particular in the case in which the evaporation atmosphere consists of air or nitrogen. In this manner, the production costs for the film are considerably cut down. On the other side, the preferential use of an electronic cannon controlled by a computer for the production of identification marks, which requires a vacuum environment for its operation in its most cost-effective—and thus more suitable for large scale use—forms, is justified in that any kind of identification mark may be carried out, both in written form and in the form of a logo, as it behaves as a writing or drawing means, for example, as an "electronic paintbrush".

The possible use of this marking technology on especially high value items has been handled in the following manner. As it is known that LiF is a material which is particularly inert towards other materials, but the certainty concerning this matter in the case of a specific material must be tested, two possible variants of the method have been developed: a) the deposition of LiF and its "writing" directly on the item (in case the safety conditions and the stability have been checked) and b) the production of identification marks on different substrates to be applied later to the item involved.

That is because in the field of cultural objects (as in all fields of high value items) each section is provided with a series of materials which are "certified" and may be safely used. For instance, the insertion of a piece of glass by means of a special acrylic glue on the canvas of a painting is a process which is authorised by the authorities in charge, thus in this case the marking may be carried out on a mark support to be applied later to the item to be marked. Therefore, in this case, it is no longer important to investigate the effect of LiF on the material of the item on the long period. Similar considerations apply in the case of the safety of the ionising radiation beam used to carry out the identification mark and preferred for the object method of the present invention; it also being totally "harmless" in the conditions defined with the present method, even if in some cases its indirect use on the item could be preferable.

The marking method object of the present invention comprising the steps of:
 depositing by evaporation on the item or on a mark support to be applied to the item to be marked a lithium fluoride film having a thickness of at least 20 nm obtained by evaporating the LiF molecules at an atmospheric pressure in an atmosphere consisting of air or nitrogen;
 irradiating the film obtained by means of a ionising radiation beam having an energy of at least 0.4 keV controlled by computerised means to carry out the desired identification mark;
and optionally the further step of:
 detecting the presence of the identification mark previously obtained by illuminating the same by means of a source of blue-ultraviolet light and possibly filtering the emitted light by means of an orange filter
in some of its forms is carried out in the conditions which have been described in detail hereafter with reference to the figures.

In order to obtain a mark of good quality in the condition of atmospheric pressure and in an atmosphere consisting of air or nitrogen the critical step of the method according the invention is the evaporation of LiF; the relevant parameters for the formation of CC are essentially the evaporation rate of LiF and the temperature of the item or the mark support to be applied thereto. As it will be readily apparent from the following detailed description of the invention these are respectively comprised in the range from 0.2 Å/s to 3 Å/s and from 15° C. to 90° C. The same range of temperature is applied during the irradiation of the item or the mark support.

FIG. 1 shows a possible configuration of an apparatus required to carry out the anti-counterfeit method, which is the object of the invention. In this embodiment thereof, such an apparatus is comprised of a movable item-holder on which the item to be marked may be placed, a device for the evaporation of LiF and an instrument suitable for the emission of a ionising radiation beam having an appropriate energy. Such devices are placed in a single chamber (1) serving to protect the operator and in which the appropriate pressure and atmosphere conditions may be obtained when the marking is carried out. For this purpose, the chamber (1) is therefore connected with relative means suitable to obtain the pressure and atmosphere conditions desired (2) during the two steps of evaporating and irradiating. In particular:
 the device for the evaporation of LiF is formed by a crucible (6) for LiF (5) connected to a heating means (4);
 the means (3) to irradiate the LiF film, obtained by evaporation, is an instrument emitting an electronic beam such as an electronic cannon or an instrument emitting a photon beam generated, for instance, from a synchrotron;
 the item to be marked (7) is placed on an item-holder (8) which is movable by appropriate means suitable for its rotation on a longitudinal or transverse axis, such a rotation on the longitudinal or transverse axis of the item-holder (8) substantially depending on the position of the evaporation and irradiation devices and such a rotation being obtainable by means of a manipulator (not shown in the figure) that allows the optimal orientation towards the two mentioned devices of the item-holder (8).

Typically, the means (2) (not shown in the figures) are, as known to a technician of the field, vacuum pumps and gas cylinders provided with appropriate closing and opening valves.

Such an instrument for the irradiation of the LiF film is controlled by computerised means (not shown in the figures) in order to obtain the desired identification mark. Hereinafter there are described a marking method which is the object of the invention in its general and specific aspects and the results obtained with reference respectively to FIGS. 2-4 and 5-6.

Figure 2:
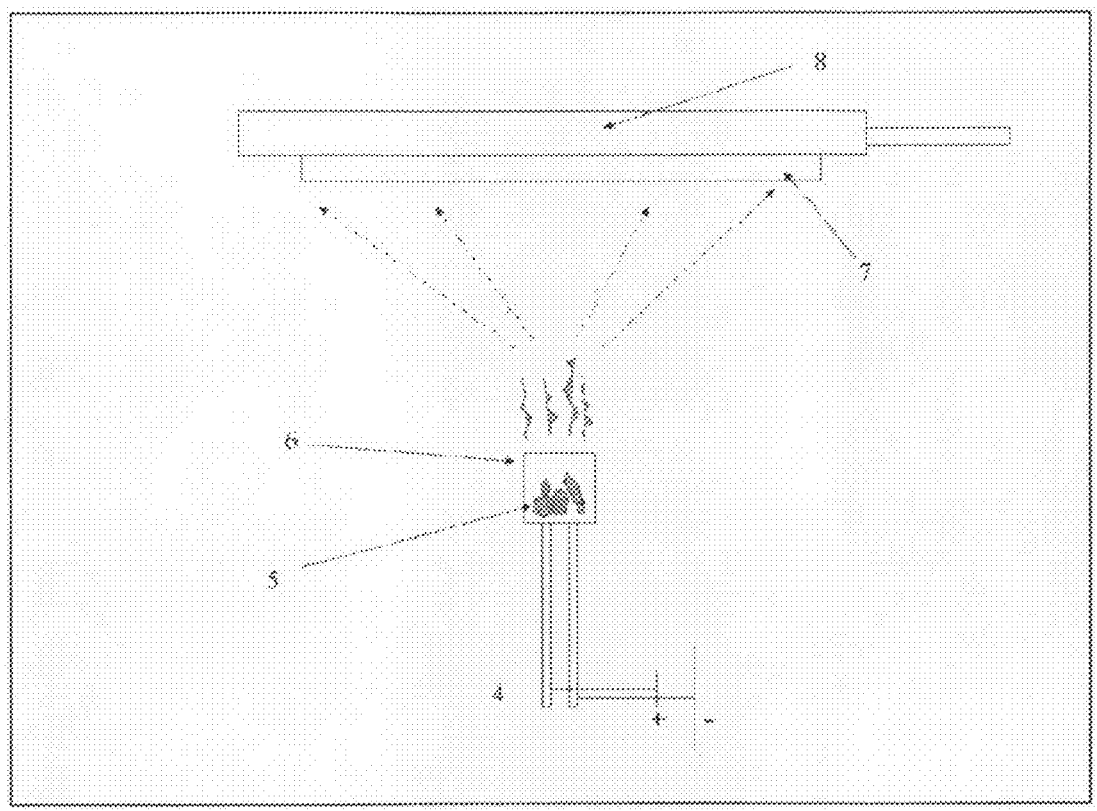
FIG. 2: the figure shows, by way of example, a diagrammatic view of the portion of apparatus in which the evaporation process is carried out, i.e. of the evaporator in which (5) is LiF placed in a crucible (6) which is heated by means of heating means (4) up to 850° C., (7) is the item to be marked, with the deposition of a vaporised LiF film, placed on an appropriate movable item-holder (8).

With reference to FIG. 2, the item (7) on which the identification mark is to be produced is mounted on an object-holder (8). At a distance in the range from 5 to 30 cm and preferably 8 cm there is placed an evaporator for LiF, which in a possible embodiment thereof is formed by a sheet of any metal alloy which is resistant to oxidation at high temperatures such as, for instance, some common kinds of steel such as AISI 310 type stainless steel or others, or a metal which does not oxidise easily at high temperatures chosen among tantalum and molybdenum having a thickness in the range from 0.05 mm to 0.3 mm, preferably 0.1 mm, folded on itself with the central flared part and the ends sealed so as to obtain a small "basket" or crucible (6). The crucible (6), which in a possible form thereof may have a volumetric size in the range from 0.2 to 1 cm$^3$, preferably about 0.5 cm$^3$, is filled with LiF crystals having a size in the range from 0.01 to 5 mm, preferably 0.5-2 mm to ease evaporation. Amorphous LiF powders having comparable size do not substantially affect the evaporation process of the same in the intended conditions with the anti-counterfeit method which is the object of the invention. Preferably the ends of the crucible (6) are connected to the poles of a current generator (4); by flowing through the walls of the crucible the current resistively heats it. The power required to take the crucible (6) having the above mentioned size and filled with LiF to a temperature of at least 850° C. (measured by means of a thermocouple of the K type) at an ambient pressure corresponds to at least 220 W.

Larger crucible (6) sizes and thicknesses for the walls thereof are possible; in this case, in order to obtain the desired evaporation of LiF, it will be required, as known by a technician in the field, to apply a higher energy, for instance, thermal energy. The measurement of the evaporation temperature may be carried out in different known ways, whereas the measurement of the flow is controlled as usual by means of a piezoelectric scale. With these parameters the evaporation flow measured by a piezoelectric scale at the above mentioned distance results being in the range from 0.2 to 3 Å/s and at this distance the area covered by LiF results being equal to about 50 cm$^2$.

The thinnest films on which it has been possible to carry out a visible text have a thickness of at least 20 nm; the intensity of the text increases as the thickness of the film increases until it reaches a maximum at about 70 nm; greater thicknesses (even up to 200 nm) do not significantly improve the properties of the identification mark, but they may be required proportionally to the roughness of the item or of the support on which the identification mark is placed.

The evaporation may be carried out in an atmosphere consisting either of air or of an inert gas such as nitrogen.

In the case of evaporation at an atmospheric pressure in air the crucible (6) may be formed by any metal alloy or metal which does not easily oxidise (and therefore break) at high temperatures, whereas in the case the atmosphere is formed by an inert gas (nitrogen) the possibility of oxidation is reduced and therefore the choice among metals and/or metal alloys broadens. Tantalum is in any case the preferred material among the previously mentioned metals.

In order to obtain films having a thickness in the range from 20 to 200 nm, the evaporation rate is in the range from 0.2 Å/s to 3 Å/s and the evaporation is carried out for a period of time in the range from 60 secs to 170 mins. The preferred evaporation rate is 1 Å/s for a distance of the item or mark support to be applied thereon of 8 cm.

In general, films having this thickness naturally adhere to items through the formation of chemical or physical bonds between LiF and the materials; the tests performed on many materials and artefacts (glass, plastics, metals, paper, coins, various items) have demonstrated that thin LiF films may be deposited (and later the identification mark may be carried out) on most materials.

In relation to the thickness of the films, the surface roughness of the items could have a great importance for an effective carrying out of the identification mark following the irradiation and thus for the success, for instance, of a text. The tests performed on some archaeological finds (coins and ancient buckles) have demonstrated in any case that also on items characterised by a very marked surface roughness, films having a thickness of 100-200 nm are required to produce a good quality identification mark.

It is known that the temperature of substrate during the deposition of LiF and its irradiation can influence the nature of the CC that can be created, the attainment of CC of defined properties is still a matter of research and discussion in the scientific community". For the purposes of the present invention the Inventors have demonstrated that performing the deposition of the LiF and the irradiation at a substrate temperature in the range from 15° C. to 90° C. results in the creation of marks of good quality. The preferred temperature is 25° C.

Figure 3:
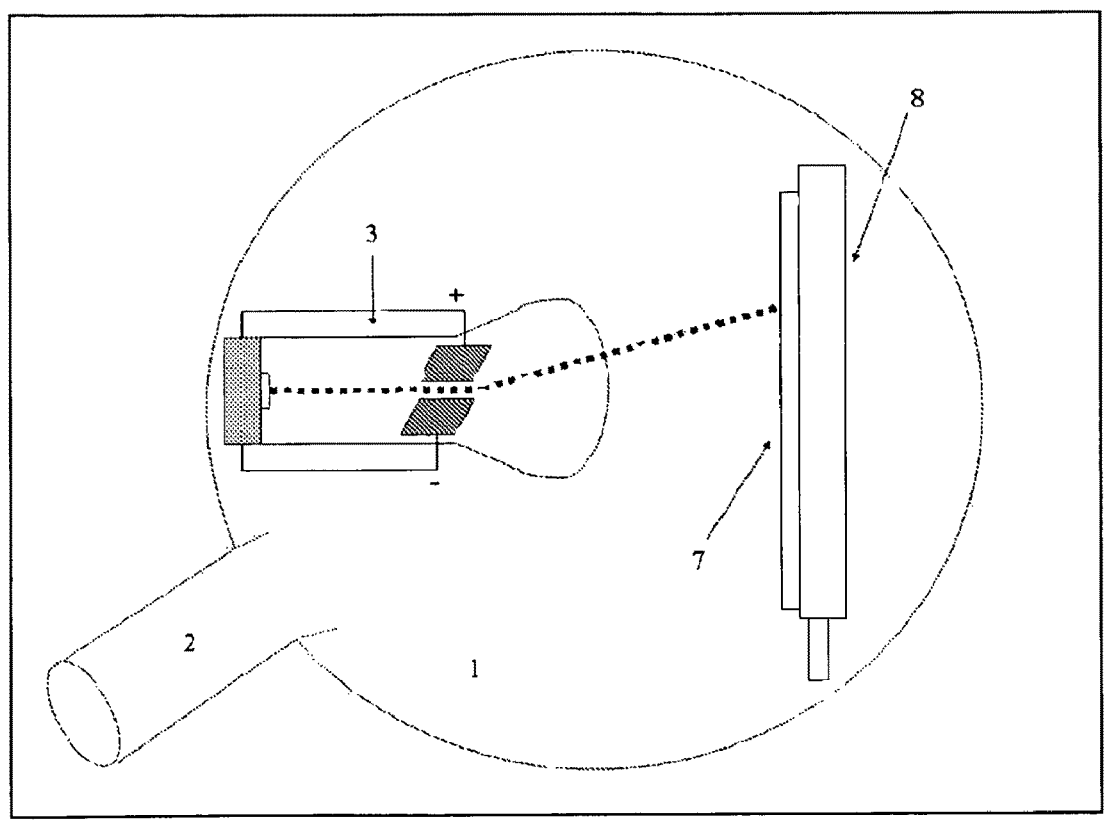
FIG. 3: the figure shows, by way of example, a diagrammatic view of the portion of apparatus with which the irradiation process of the LiF film is carried out and the figure specifically shows an instrument capable of emitting an electronic beam of the appropriate energy and i.e. an electronic cannon (3) placed in a chamber (1) connected to means suitable to obtain the desired vacuum (2) placed at an appropriate distance from the object to be marked (7) placed in turn on the movable item-holder (8).

With reference to FIG. 3, when the instrument emitting ionising radiations (3) is an electronic cannon, it is required to operate under vacuum conditions. In this case in the chamber (1) a vacuum condition in the range from $5 \times 10^{-3}$ mbars to $5 \times 10^{-7}$ mbars is obtained or the substrate on which the LiF film has been deposited is introduced in a vacuum chamber at least in the same vacuum regimen, preferably high-vacuum (HV) (pressure<$1 \times 10^{-4}$ mbars), where the electronic cannon (3) is present, the beam of which may be deviated horizontally and vertically in a controlled manner. The electron energy used to carry out the identification mark is comprised in the range from 1 to 5 keV, preferably 3 keV, and the emission current of the cannon is in the range from 0.01 µA to 0.1 µA, preferably equal to about 0.05 µA. The distance between the cannon and the sample depends on the kind of electronic cannon employed, usually being that recommended by the manufacturer of the cannon; in the specific case it corresponds to a focal distance of 32 mm.

The irradiation time is closely related to the quality and size of the texts which may be obtained. Overexposures in the irradiation thus widen the line of the text and modify the structure thereof (no longer a full line, but two parallel lines instead). The result is a blurred illegible text. Instead, underexposures do not create a number of CCs sufficient to allow to easily read the text. The irradiation time is related both to the energy of the electronic beam and to the emission current of the cannon used. For the purposes of the present invention the irradiation time for every dot of the text is in the range from 1 to 30 secs and is preferably equal to 10 secs.

Another aspect which is especially important for the quality of the mark is the size of the spot of the ionising radiation beam which must be in the range from 200 nm to 2 mm and is preferably 80 µm.

Still with reference to FIG. 2, when the instrument emitting ionising radiations (3) is the Synchrotron radiation (and therefore the ionising beam is formed by photons), it is required to operate under high vacuum conditions. In this case, the substrate on which the LiF film has been deposited is introduced in a vacuum chamber (1) in a regimen in the range from $1 \times 10^{-11}$ mbars to $5 \times 10^{-6}$ mbars and preferably ultra-high vacuum (UHV) (pressure<$10^{-9}$ mbars) where there is a synchrotron radiation beam which may be deviated horizontally and vertically in a controlled manner. The energy of the photons used for the carrying out of the identification mark is in the range from 0.4 to 1.2 keV and is preferably 0.65 keV and the density of photons on the sample is in the range between $10^{17}$ and $10^{20}$ photons/secs/cm$^2$ and is preferably equal to about $10^{19}$ photons/secs/cm$^2$. The system employed includes the focussing of the photon beam by means of Fresnel lenses (Zone Plates), therefore the texts must be carried out at a focal distance which in this specific case is equal to 10 mm. For the purposes of the present invention the irradiation time for every dot of the text is in the range from 10 to 100 msecs and is preferably equal to 10 msecs. The size of the photon spot, which determines the size of the identification mark, may be varied by changing the kind of focussing lens and typically has values in the range between 200 nm and 5 µm.

By way of example, it may be mentioned that by the method which is the object of the invention the smallest area with CCs ever achieved may be obtained, it having a size corresponding to about 300-400 nm, this result has been obtained with a ionising source which had a definitely smaller size (some tens of nm). The reason for this is that the physical process for the creation of the CCs automatically broadens the spatial size. If a range is to be indicated for the size of the ionising radiation spot to be used for the marking method of the invention, 200 nm may be indicated (in the case of the Synchrotron radiation) as a lower limit and 2 mm as the maximum width obtained by the electronic cannon (corresponding to a range of widths of the areas with the CCs between 500 nm and 2 mm). For all practical purposes, in any case, the size of the beam (except for the case of the lower limit of 200 nm) is chosen on the basis of the size of the identification mark to be obtained.

The instrument emitting the ionising radiation beam (3) is controlled by a computer (not shown in the figures) which, by using it as writing means or paintbrush, allows to produce identification marks in the form of characters and logos.

The areas of the LiF film irradiated by the ionising radiation beam result being indistinguishable from the rest of the film under natural light.

Figure 4:
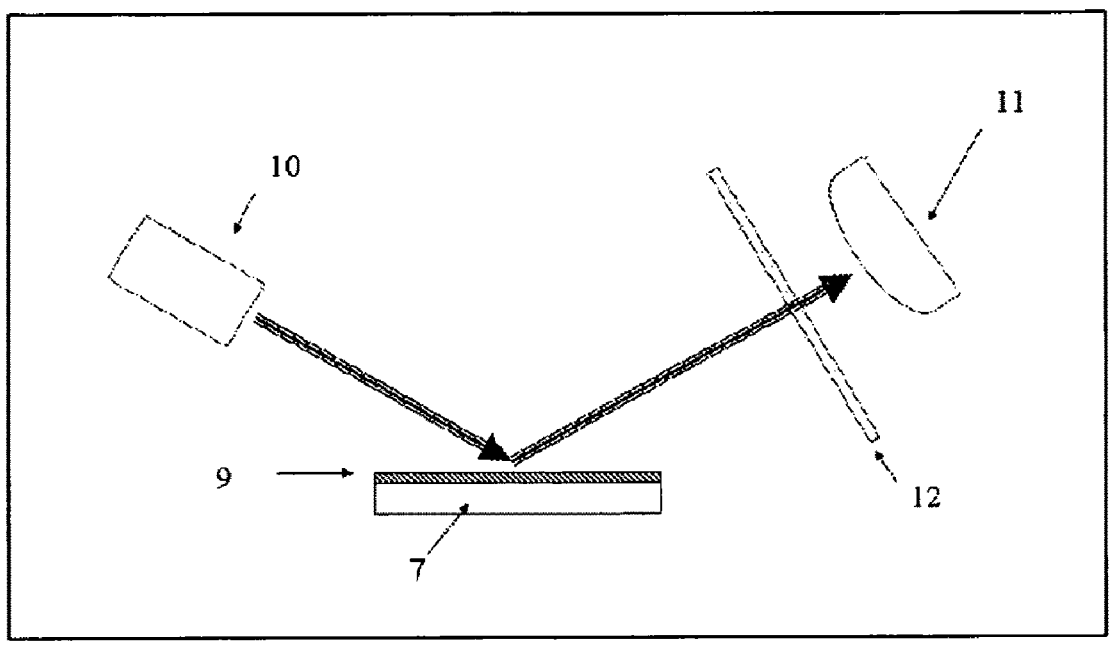
FIG. 4: the figure shows, by way of example, a diagrammatic view of the apparatus for the detection of the identification mark in which (10) is a source of exciting light which emits a radiation in the blue-UV region which is incident on the irradiated LiF film (9) deposited on the item (7) and (11) is a detection system for the fluorescent radiation emitted by the identification mark and (12) a filter suitable to select the light deriving from the identification mark.

The system for the detection of the texts is schematically shown in FIG. 4. The item or the mark support (7) with the irradiated LiF film (9) is illuminated by a source (10) that emits in the region of blue-ultraviolet (wavelength<460 nm); the irradiated portion of film will emit light in the red region of the spectrum (600-700 nm) detected with an instrument (11), for instance a fluorescence microscope, for identification marks which are not visible to the naked eye. The orange filter (12) is optional and is useful in the case the mark is observed with the naked eye to mask the diffused light from the illuminating source (10) which otherwise covers the light emitted by the same. The use of a blue-UV source is related to the fact that the absorbance spectrum typical for the $F_2$ and $F_3^+$ colour centres created in the LiF is centred at about 450-460 nm.

Every CC system is characterised by its own absorbance spectrum and emission spectrum. A further method to verify the originality of the mark is to measure either the absorbance spectrum (only possible if the film is deposited on transparent substrates) or the emission spectrum (possible with all systems) which is distinctive of that system. There are systems available commercially which measure these spectra.

A reading system for the text is based on the use of an optical microscope where the conventional light source is replaced by a mercury vapour lamp which is characterised by an emission spectrum which extends to the ultraviolet region. This kind of microscope is usually provided with filters which allow to select a specific light band. The focussed objective lens of the microscope, which generally both conveys excitation light on the sample and detects emitted light therefrom, avoids having an extremely diffused background light and thus the need for an orange filter.

For larger marks which are readable with the naked eye, the detection means may be an extremely cost-effective system based on a solid state led capable of providing a maximum power of 1 W with an emission centred at 460 nm (real blue) supplied by two 1.5V AA batteries capable of providing a power supply of 3.0 V which is sufficient to supply power to the led; the device may also be equipped of a small lens for the focussing of the light. As a filter, a transparent orange plastic sheet may be used (Kapton material).

A use thereof on a large scale or on everyday use goods may for instance include the protection of films in order to avoid contact with the LiF film and/or the accidental removal. Such a protection may be obtained by means of the adhesion of a second transparent substrate (glass or plastic) by means of a common acrylic glue or transparent silicon resins. Such a further treatment does not imply any alteration of the LiF film and of the identification mark.

EXPERIMENTAL PART

The validation experimental activity for the inscriptions carried out on lithium fluoride (LiF) film has provided for the setting up of an experimental apparatus for vacuum regimens and low vacuum required for the evaporation of the LiF films and for the production of texts by means of an electronic cannon.

The experimental apparatus used for the evaporation of LiF at atmospheric pressures consists of a vacuum chamber equipped with a small turbomolecular pump which allows it to achieve a base pressure of about $10^{-7}$ mbars, and with a valve allowing to section the pumps and leave the apparatus in static vacuum (i.e. not pumped). An apparatus of this kind at the state of the art allows to maintain, if the pumping is interrupted, a HV environment even for days in the same regimen of pressure. The chamber is further provided with a valve connected each time to a gas cylinder of the preselected gas to control the introduction of the same in the chamber. By acting on this valve it is therefore possible to "fill" the static vacuum apparatus with the preselected gas at the atmospheric pressure and to maintain the system in these conditions. A sensor of the Pirani kind, which is capable of measuring atmospheric pressures has been used as a pressure meter.

In such a chamber there is placed a sample manipulator for items displaying sizes up to about 20×20 mm$^2$ and thicknesses up to 10 mm, whereas the LiF evaporator consists in a Ta sheet having a thickness of 0.1 mm folded on itself, the central part being flared and the end being joined so as to obtain a small "basket" (crucible). The ends have been connected to the poles of a current generator; this sliding through the walls of the crucible heats it in a resistive manner by means of a tungsten resistor.

The power required to take the crucible filled with LiF to a temperature of at least 850° C. at an ambient pressure corresponds to about 220 W. In the case of pressures higher than the HV regimen, the temperature being equal, the power employed has to be increased because a greater number of molecules in the atmosphere around the crucible aids the cooling thereof. By way of example, a power of 140 W is required to heat the same crucible to the same temperature but in a HV environment. In the case of the 4 gases tested at an atmospheric pressure (air, nitrogen, helium, argon) the power required has virtually been the same for all four gases.

Also in this case the temperatures have been monitored with a thermocouple of the K type. The crucible having volumetric dimensions of about 0.5 cm$^3$ has been filled with LiF having maximum dimensions of 1 mm; such an amount was sufficient to evaporate about 1 µm of LiF.

The evaporation conditions being the same, the amount of LiF which may be evaporated on the sample decreases as well in the case in which the evaporation atmosphere is more "dense", this owing to the fact that the LiF molecules encounter more obstacles on their path to the sample and therefore may use up all of their kinetic energy before reaching the target. For this reason it has been necessary to draw the sample closer to about 8 cm from the evaporator and increase the evaporation time with respect to the conditions under HV. At this distance the deposition rate is virtually the same existing in the HV system at a distance between the sample and the evaporator of 19 cm equal to about 1 Å/s.

The thickness of the LiF films obtained ranges from about 20 nm to 200 nm; below 20 nm the texts are no longer visible, whereas thicknesses greater than 70 nm do not improve the quality of texts. The thicknesses have been measured by means of AFM microscopy. Through the use of a piezoelectric scale, after the initial calibration, it has been possible to reproduce the thicknesses in the various operations in an accurate manner. The temperature on the samples because of the closeness of the LiF evaporator during the evaporation step can raise up to 80° C.

Subsequently, the LiF films deposited by evaporation have been irradiated with an electronic cannon placed at a focal distance of 32 mm from the surface of the sample and mounted at a 90° angle with respect to the evaporator. The irradiation has been performed when LiF film was cooling down, the temperature was then comprised between 80° C. and room temperature. With a simple rotation of the manipulator it is therefore possible to pass from the evaporation step to the writing step. The cannon used is produced by SPECS GmbH (EQ 22 model). The size of the electronic beam produced by this cannon with the parameters used is of about 80 µm; this obviously determines the width of the texts which may be obtained with this instrument.

During the initial tests the parameters of the electronic cannon and the exposure time have been adjusted. These parameters have resulted substantially independent from the thickness of the LiF film to irradiate.

To validate the object method of the invention different experimental tests have been carried out according to 2 distinct modes depending on the type of items to be marked and on the technical difficulties encountered:

a) directly on the object
b) on an external mark support to be subsequently applied to the object.

Different kinds of samples (Si, metal plates, plastics) with LiF evaporations obtained at atmospheric pressures of air, nitrogen, helium and argon have been produced. For the direct comparison monocrystal samples of Si have been used so as to have the same support for every evaporation. The texts on these samples have then been carried out in a HV environment.

The control of the texts has been carried out with a reduced size optical fluorescence microscope capable of a spatial resolution greater than that used for the texts.

The samples produced by evaporating LiF in air or nitrogen have confirmed the presence of the texts characterised by the same intensity of the equivalents produced under HV. Only a closer analysis carried out under an optical microscope has detected a more uniform and less dotted structure of the line shape.

The samples produced in helium and argon atmospheres (in spite of the longer evaporation times) have not displayed the presence of any text. In the following table a summary is shown of the results obtained in the different evaporation conditions indicated.

| atmosphere | pressure | time | results |
| --- | --- | --- | --- |
| Air | $5.4 \times 10^2$ mbars | 20 mins | Visible texts different from those obtained under vacuum displaying a more even and less dotted structure |
| $N_2$ | $3.8 \times 10^2$ mbars | 20 mins | Visible texts different from those obtained under vacuum displaying a more even and less dotted structure |
| $He_2$ | $5.4 \times 10^2$ mbars | 40 mins | No visible text |
| Ar | $5.4 \times 10^2$ mbars | 45 mins | No visible text |

The first tests for the evaporation of the LiF films and the carrying out of the marks have demonstrated that the surfaces of different items may be subjected to various processes required to carry out, for instance, texts in a completely transparent manner.

Considered the virtually total absence of protocols for the use of these marks on cultural objects, it has been decided to produce a certain number of marks having different size and support, to be directly tested on the artefacts during the everyday activities concerning restoration and preservation of the same. For this reason 5 small size (10-30 mm$^2$) thin (0.1 mm) glass marks protected by as many glass slides, 4 small size (10-20 mm$^2$) thin (0.2 mm) plastic supports and some thin nylon threads (diameter 0.1 mm) with very small texts have been prepared.

The texts have been carried out in two different formats: large texts and small texts. The large texts are formed by 5 numbers each of which having a size of 1×0.5 mm$^2$ and illuminated by a blue-UV lamp, they are easily readable with the naked eye: the small texts, instead, are formed by the same 5 numbers, each of which having a size of 0.6×0.3 mm$^2$, these numbers are more easily readable with a fluorescence microscope. Some marks have been carried out using the synchrotron radiation with which very small texts may be obtained.

Figure 5:
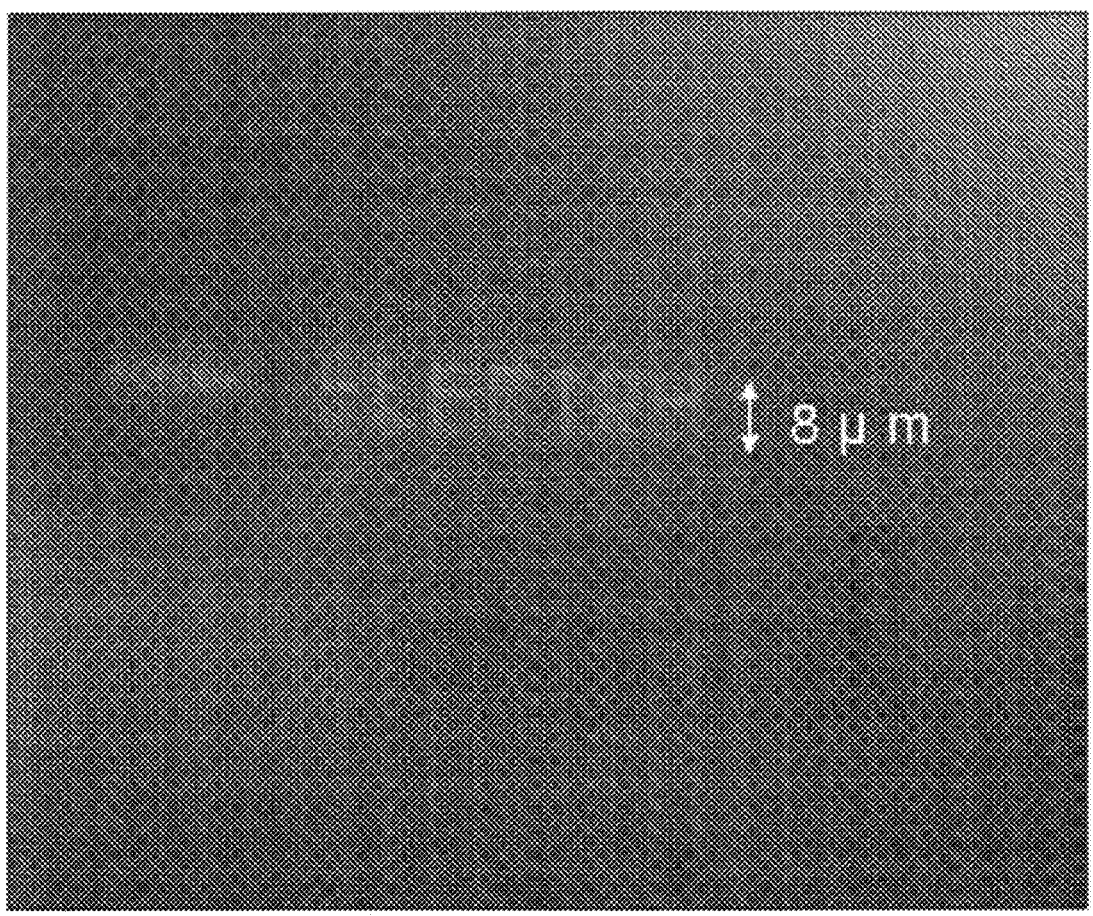
FIG. 5: the figure shows, by way of example, a text obtained on a thread made of nylon having a diameter of 0.1 mm; the name "ELETTRA" has been impressed. The largest text that may be read has a size of 8×36 µm, whereas the smallest that may not be read at this magnification has a size of 2×10 µm.
Figure 6:
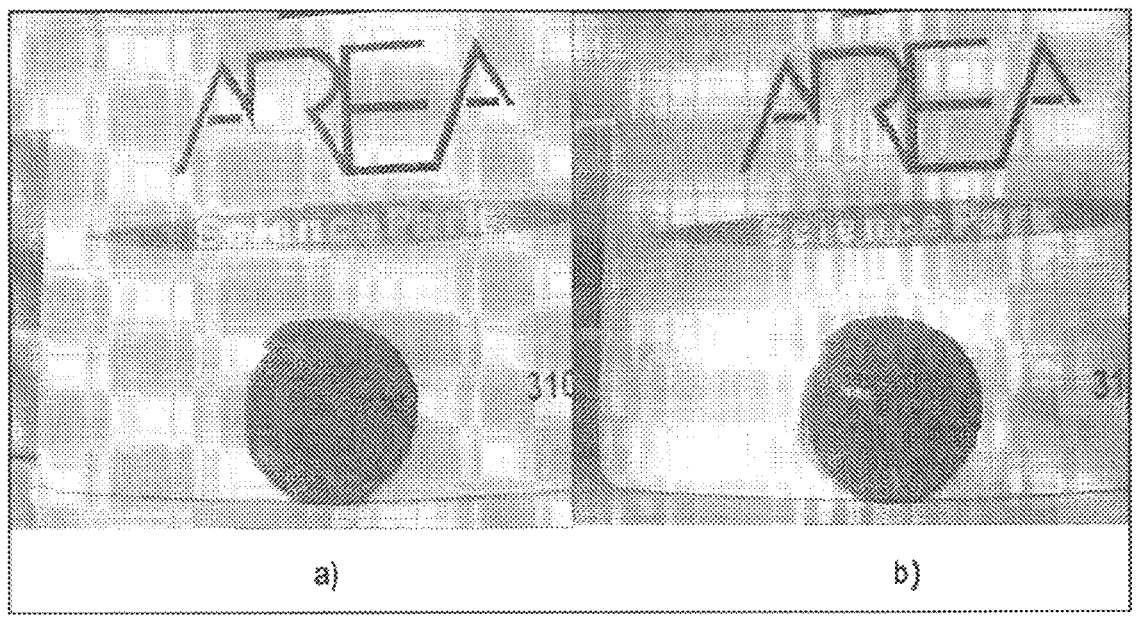
FIG. 6: the figure shows, by way of example: a) a photograph of the back of a Roman period coin on which the LiF coating has been carried out and the text has been carried out, illuminated by natural light; b) the same coin illuminated by blue-UV light, the photograph has been obtained through an orange filter.

Specifically, an alphanumeric code has been impressed on some nylon threads having a diameter of 0.1 mm covered by LiF; the texts have a size equal or smaller than 8×32 µm$^2$. The fluorescent text carried out on a thread is shown in FIG. 5.

Furthermore, different tests have been carried out on different coins, both ancient and modern, which in virtually all cases have produced good quality texts. By way of example of the marks obtainable by the present method, in FIG. 6 there are shown pictures of texts carried out on a Roman period coin as they appear under visible light and under blue-UV illumination. The series of 5 numbers is clearly visible.

The materials used as a support for the texts to be subsequently applied to the tested objects during the course of this validation have been substantially glass and plastics as they are materials suitable for use in cultural objects. Commercial glass slides having a small thickness (0.1 mm) and different kinds of plastics (PET, PC, polypropylene, with thicknesses from 1 mm to 0.012 mm) have been used for the tests. All of these materials have been used in their original conformation, i.e. post-production conformation; no particular cleaning or surface alteration procedure (typically surface smoothing) has been applied. These surfaces were in any case characterised by a low surface roughness: a few dozen nanometers for plastics and a few hundred nanometers for glass.

The processes for the deposition of LiF and for the carrying out of texts on various materials (comprising ancient coins) have demonstrated the neutrality of these processes; the LiF films in the range of thicknesses used in the tests (from 20 to 200 nm) are virtually invisible and do not alter the surface chemistry of the samples, the texts carried out with electronic cannons and with synchrotron radiation do not even slightly modify the irradiated samples from a chemical and/or morphological point of view.

After 10 months, after many writing tests and following operations of erasion, no variations were noticed on the surface of the coins. The removal of the LiF film takes place by the mechanical friction with paper or cotton. In the case of supported marks there are attaching materials (glues) the use of which is allowed for these high value goods Specifically, an acrylic glue has been tested which may be also applied on the exposed sides of the paintings and has proved perfectly compatible with the texts and LiF films. Furthermore, it has been possible to remove the glue with specific solvents (these are used by restorers as well) leaving the mark unaltered.

The marks supported by plastic and glass films have been subjected to controlled temperature and humidity stability tests: a) 4 h at T=80±2° C.; b) 4 h at T=40±2° C. and relative humidity f=90%; c) 16 h at T=−20±2° C. The intensity and the shape of the texts has been measured before and after performing the tests, without detecting any modification. Many other "empirical" tests have been performed to test the marks in "everyday" use, for instance, exposing them to environmental climate conditions, attaching and detaching them many times from the items, frequently manipulating them, etc.; these tests have given very positive results therefore confirming the resistance and stability of the marks.

However, in order to avoid any risk potentially deriving from LiF, the simplest method is to protect a mark with an equivalent piece of substrate; for instance, a glass slide on which a text has been carried out with another glass slide glued with a transparent glue; or a plastic substrate with another plastic substrate if flexibility is to be maintained. All of these solutions have the property to totally protect the texts and increase the life-time as well as to avoid an accidental contact with the LiF. Some organic resins have been tested which are validated for human contact and are used in the electronic industry deposited by spin-coating on the texts; after the hardening of the resins, the texts were already visible.

The invention claimed is:

1. A method for marking an item comprising at least the steps of:
   depositing by evaporation a lithium fluoride film having a thickness of at least 20 nm obtained by evaporating the same on the item or on a mark support to be applied to the item to be marked;
   irradiating the previously obtained lithium fluoride film by means of a ionising radiation beam having an energy of at least 0.4 keV controlled by computerised means to carry out the desired identification mark,
   wherein the depositing step is performed at an atmospheric pressure and in an atmosphere consisting of air or nitrogen.

2. The method according to claim 1 comprising the further step of:
   detecting the presence of the identification mark obtained by illuminating the same by means of a light source emitting a blue-ultraviolet light.

3. The method according to claim 1 comprising the further steps of
   detecting the presence of the identification mark obtained by illuminating the same by means of a light source emitting a blue-ultraviolet light;
   controlling the authenticity of the identification mark by means of the measurement of the absorbance or emission spectrum of the same.

4. The method according to claim 1, wherein the temperature of the item or of a mark support to be applied to the item during the steps of evaporation and irradiation is in a range comprised from 15° C. to 90° C.

5. The method according to claim 4, wherein said temperature is 25° C.

6. The method according to claim 1, wherein a lithium fluoride film having a thickness in the range from 20 to 200 nm is obtained by:
   evaporating lithium fluoride at a flow rate in the range from 0.2 Å/s to 3 Å/s for a time in the range from 60 secs to 170 mins;
   placing the item or the mark support at a distance in the range from 5 to 30 cm from the evaporator.

7. The method according to claim 6, wherein the lithium fluoride film is obtained by:
   evaporating lithium fluoride with a flow rate of 1 Å/s;
   placing the item or the mark support at a distance of 8 cm from the evaporator.

8. The method according to claim 6, wherein lithium fluoride has a granulometry in the range from 0.01 to 5 mm.

9. A method according to claim 8, wherein lithium fluoride has a granulometry of 0.5-2 mm.

10. The method according to claim 1, wherein the irradiation is obtained under vacuum conditions in the range from $5 \times 10^{-3}$ to $5 \times 10^{-7}$ mbars with a ionising radiation beam having an energy in the range from 1 to 5 keV emitted by an electronic cannon with an emission current in the range from 0.01 to 0.1 µA.

11. The method according to claim 10, wherein the irradiation is obtained under vacuum conditions of $<1 \times 10^{-4}$ mbars with a ionising radiation beam having an energy of 3 keV emitted by an electronic cannon with an emission current of 0.05 µA.

12. The method according to claim 10, wherein the irradiation is obtained for a time in the range from 1 to 30 secs.

13. The method according to claim 10, wherein the irradiation is obtained for a time of 10 secs.

14. The method according to claim 10, wherein the ionising radiation beam spot has a size in the range from 200 nm to 2 mm.

15. The method according to claim 10, wherein the ionising radiation beam spot has a size of 80 µm.

16. The method according to claim 1, wherein the irradiation is obtained under vacuum conditions in the range from $1 \times 10^{-11}$ to $5 \times 10^{-6}$ mbars with a ionising radiation beam having an energy in the range from 0.4 to 1.2 keV with a density in the range from $10^{17}$ to $10^{20}$ photons/secs/cm$^2$ emitted by a synchrotron.

17. The method according to claim 16, wherein the irradiation is obtained under vacuum conditions $<10^{-9}$ mbars with a ionising radiation beam having an energy of 0.65 keV with a density of $10^{19}$ photons/secs/cm$^2$ emitted by a synchrotron.

18. The method according to claim 16, wherein the irradiation time for each dot of the identification mark is in the range from 10 to 100 msecs.

19. The method according to claim 16, wherein the irradiation time for each dot of the identification mark is 10 msecs.

20. The method according to claim 16, wherein the ionising radiation beam has a the photon spot size in the range from 200 nm to 5 µm.

21. The method according to claim 2, wherein the identification mark is detected by means of a fluorescence microscope.

22. The method according to claim 2, wherein the identification mark is detected by means of an instrument emitting a light in the blue-ultraviolet region which illuminates the identification mark and an orange filter.

* * * * *